United States Patent
Subramanian

(10) Patent No.: US 7,510,743 B2
(45) Date of Patent: Mar. 31, 2009

(54) PROCESS FOR MANUFACTURING DEVICE HAVING HONEYCOMB-STRUCTURE THERMAL BARRIER COATING

(75) Inventor: Ramesh Subramanian, Oviedo, FL (US)

(73) Assignee: Siemens Energy, Inc., Orlando, FL (US)

( * ) Notice: Subject to any disclaimer, the term of this patent is extended or adjusted under 35 U.S.C. 154(b) by 669 days.

(21) Appl. No.: 11/007,506

(22) Filed: Dec. 8, 2004

(65) Prior Publication Data
US 2005/0214564 A1 Sep. 29, 2005

Related U.S. Application Data

(62) Division of application No. 09/859,092, filed on May 16, 2001, now Pat. No. 6,846,574.

(51) Int. Cl.
*B05D 3/00* (2006.01)
(52) U.S. Cl. .............. 427/259; 427/555; 427/230; 427/181; 427/190; 427/202; 427/205
(58) Field of Classification Search .......... 427/259, 427/282, 553, 554, 555, 230, 180, 181, 189–191, 427/201–203, 205
See application file for complete search history.

(56) References Cited

U.S. PATENT DOCUMENTS

| | | |
|---|---|---|
| 4,177,308 A | 12/1979 | Beeler |
| 4,289,447 A | 9/1981 | Sterman et al. |
| 4,293,357 A | 10/1981 | Higuchi et al. |
| 4,405,284 A | 9/1983 | Albrecht et al. |
| 4,457,948 A | 7/1984 | Ruckle et al. |
| 4,557,773 A | 12/1985 | Bonzo |
| 4,639,388 A | 1/1987 | Ainsworth et al. |
| 4,664,600 A | 5/1987 | Perry |
| 4,764,089 A | 8/1988 | Strangman |
| 4,802,828 A | 2/1989 | Rutz et al. |

(Continued)

FOREIGN PATENT DOCUMENTS

DE 42 38 369 A1 5/1994

(Continued)

OTHER PUBLICATIONS

Vacuum Process Engineering, Inc. Diffusion Bonding http://www.vpei.com/P4-Diffusion_Bonding.htm.

(Continued)

*Primary Examiner*—William Phillip Fletcher, III

(57) ABSTRACT

A process for manufacturing a device adapted for exposure to high temperatures. A support structure for retaining a ceramic insulating material on a substrate is formed by the deposition of a support structure material through a patterned masking material. The support structure can define cells into which the ceramic insulating material is deposited following removal of the masking material. The support structure may be a composite metal-ceramic material having either discreet layers or a graded composition deposited by an electro-deposition process followed by a heat treatment to form a solid state diffusion bond with the substrate. The ceramic filler material may be deposited by the electrophoretic deposition of ceramic particles coated with a bonding material that is subsequently heated to oxidize and to bond the particles together. The support structure may be formed with inclined walls in order to improve its resistance to foreign object impact damage.

16 Claims, 4 Drawing Sheets

U.S. PATENT DOCUMENTS

| | | | |
|---|---|---|---|
| 4,824,711 | A | 4/1989 | Cagliostro et al. |
| 4,867,639 | A | 9/1989 | Strangman |
| 4,916,022 | A | 4/1990 | Solfest et al. |
| 5,057,379 | A | 10/1991 | Fayeulle et al. |
| 5,064,727 | A * | 11/1991 | Naik et al. .................. 428/593 |
| 5,178,975 | A * | 1/1993 | Ng Chiong et al. ............ 430/5 |
| 5,180,285 | A | 1/1993 | Lau |
| 5,310,592 | A | 5/1994 | Baker et al. |
| 5,415,715 | A | 5/1995 | Delage et al. |
| 5,419,971 | A | 5/1995 | Skelly et al. |
| 5,514,445 | A | 5/1996 | Delage et al. |
| 5,576,069 | A | 11/1996 | Chen et al. |
| 5,683,825 | A | 11/1997 | Bruce et al. |
| 5,705,231 | A | 1/1998 | Nissley et al. |
| 5,780,146 | A | 7/1998 | Mason et al. |
| 5,780,171 | A | 7/1998 | Nissley et al. |
| 5,830,586 | A | 11/1998 | Gray et al. |
| 6,013,592 | A | 1/2000 | Merrill et al. |
| 6,074,706 | A | 6/2000 | Beverley et al. |
| 6,197,180 | B1 * | 3/2001 | Kelly ......................... 205/118 |

FOREIGN PATENT DOCUMENTS

| | | |
|---|---|---|
| EP | 0 452 880 A1 | 10/1991 |
| EP | 0 494 389 A1 | 7/1992 |
| WO | WO 00/52307 | 9/2000 |

OTHER PUBLICATIONS

UKAEA Special Techniques Group Specialising in Solid-Phase Diffusion Bonding http://www.fusion.org.uk/stg/bonding.htm.

Welcome to the Metallurgical and Materials Transactions A Department http://doc.tms.org/Site/Products.psf/2a4402...

D.K.Das, Vakil Singh, and S.V. Joshi The Cyclic Oxidation Performance of Aluminide and Pt-Aluminide Coatings on Cast Ni-Based Superalloy CM-247.

* cited by examiner

PROCESS FOR MANUFACTURING DEVICE HAVING HONEYCOMB-STRUCTURE THERMAL BARRIER COATING

CROSS REFERENCE TO RELATED APPLICATION

This is a divisional application of U.S. patent application Ser. No. 09/859,092, filed May 16, 2001, now U.S. Pat. No. 6,846,574 B2, and claims the benefit thereof.

FIELD OF THE INVENTION

This invention relates generally to the field of thermal barrier coatings for high temperature applications, and more particularly to a ceramic thermal barrier coating supported on a metal substrate by a honeycomb or other three-dimensional structure that has a solid state diffusion bond to the substrate, and specifically to a graded metal-ceramic support structure for a thermal barrier coating and a process for forming the same.

BACKGROUND OF THE INVENTION

It is known that the efficiency of a combustion turbine engine will improve as the firing temperature of the combustion gas is increased. The firing temperature of modern gas turbine engines exceeds the safe operating temperature of the metals used to form many of the engine components. As a result, it is known to apply a thermal barrier coating to protect an underlying metal substrate in portions of the engine exposed to extremely high temperatures.

Ceramic thermal barrier coatings are typically applied using a high temperature process, such as APS or EB-PVD. In a typical application, a nickel or cobalt based super alloy substrate is first coated with a layer of a bond coat material, such as MCrAlY or alumina, and then insulated with a layer of ceramic material. Typical ceramic insulating materials include zirconium oxide or hafnium oxide stabilized with yttrium. The thermal barrier coating is attached to the underlying bond coat and substrate along a single interface plane. Such coatings, however, are prone to failure due to the cracking and eventual separation or spalling of the ceramic coating from the underlying substrate caused by differing coefficients of thermal expansion and other causes. Accordingly, this leads to a conservative engine design because the integrity of the thermal barrier coating cannot be assured. Such conservative designs tend to utilize more cooling air and less thermal barrier coatings to lower the firing temperature, or otherwise lower the overall engine efficiency.

U.S. Pat. No. 4,639,388 dated Jan. 27, 1987, describes a method for reinforcing a thermal barrier coating so that the ceramic material is secured to the substrate along more than the single interface plane. That patent describes a metallic honeycomb structure that is metallurgically bonded to the substrate, with ceramic insulating material then deposited within the cells of the honeycomb structure. In addition to a honeycomb structure, other forms of metallic reinforcing structures are described in the patent, including pins, tabs, and coiled wires. The reinforcing structure may be formed to be integral with the substrate, or it is brazed, welded or diffusion bonded to the substrate material. While such a structure provides an improved mechanical bond between the insulating ceramic and the substrate, it has several disadvantages which limit its commercial application. For example, a prefabricated honeycomb structure is useful for flat surfaces, but can not conveniently be bonded to a curved surface, such as an airfoil surface. A brazed bond between the reinforcing structure and the substrate creates a temperature limitation due to the low melting temperature of the braze material. A weld bond between the reinforcing structure and the substrate involves the introduction of undesirable heat into the material. Welding and brazing onto a concave or convex surface is very difficult to accomplish on a production basis. Finally, the thermal conductivity of the metal reinforcing structure itself decreases the overall insulating effectiveness of the thermal barrier coating layer.

U.S. Pat. Nos. 5,419,971 and 6,074,706, respectively dated May 30, 1995 and Jun. 13, 2000, describe a thermal barrier coating system having an interfacial layer with a pattern of small, shallow three-dimensional features such as grooves or dimples each having depths and widths of about 12.7 to about 25.4 micrometers. A thermal barrier coating is deposited into the small, shallow features and over the interfacial layer. These systems recognize and accept that cracks form between the interfacial layer and thermal barrier coating, and seek to arrest crack propagation by placing obstacles in the form of the small, shallow features into the crack path. While these systems may or may not achieve their intended result of merely delaying crack propagation, they do not and cannot localize and segregate the cracks to prevent them from combining with other cracks within the system.

SUMMARY OF THE INVENTION

Accordingly, an improved thermal barrier coating system and a method of manufacturing such a thermal barrier coating is needed. The thermal barrier coating should exhibit a tight bond to the substrate material without relying on a braze, weld or diffusion bond joint. Furthermore, the heat transfer rate through the thermal barrier coating should be minimized. Further, the improved thermal barrier coating system should be useful for both flat and curved surfaces. Yet further, the improved thermal barrier coating system can localize and segregate cracks to prevent them from combining with other cracks.

Accordingly, a device adapted for exposure to high temperatures is described herein as including: a substrate; a support structure having a solid state diffusion bond to the substrate and defining a plurality of volumes proximate a top surface of the substrate; and a thermally insulating filler material disposed in the plurality of volumes. The support structure may include a material having a first composition in a bottom layer proximate the substrate and a second composition in a top layer opposed the substrate. The first composition may be a MCrAlY material and the second composition may be a ceramic material. The support structure may be a metal-ceramic composite material wherein the ceramic content of the composite material is higher in a top portion remote from the substrate than in a bottom portion proximate the substrate, with the ceramic content being graded or changing in one or more discrete increments.

A process for insulating a substrate with a thermal barrier coating is described herein as including: coating a top surface of a substrate with a layer of masking material; removing a selected portion of the masking material to form a pattern of first volumes in the layer of masking material; depositing a support structure material in the first volumes to form a support structure attached to the top surface of the substrate; removing a remaining portion of the masking material to form a pattern of second volumes; and depositing a thermally insulating filler material in the second volumes.

The process for insulating a substrate with a thermal barrier coating may further include: selecting the masking material to be a photo-resist material; and wherein the step of removing a selected portion of the masking material comprises: exposing the photo-resist material to a pattern of energy to define a pattern of developed and undeveloped photo-resist material; and removing one of the developed and the undeveloped photo-resist material to form the pattern of first volumes.

The process for insulating a substrate with a thermal barrier coating may alternatively include removing a selected portion of the masking material by applying laser energy to the layer of masking material to vaporize a selected portion of the masking material to form the pattern of first volumes.

Both the support structure material and the ceramic insulating material are described as being deposited by electro-deposition processes. In this manner, the support structure and the underlying substrate are joined by a solid state diffusion bond formed as a part of the heat treatment sequence resulting in a metallurgical bond. The thermally insulating filler material may be electro-deposited in the form of particles of a ceramic material coated with a bonding material. The particles are then heat to cause them to oxidize and to bond together. The bonding material may be nickel, and the space between the particles may be filled with aluminum during a pack aluminizing step.

BRIEF DESCRIPTION OF THE DRAWINGS

The features and advantages of the present invention will become apparent from the following detailed description of the invention when read with the accompanying drawings in which.

DETAILED DESCRIPTION OF THE INVENTION

Figure 1:
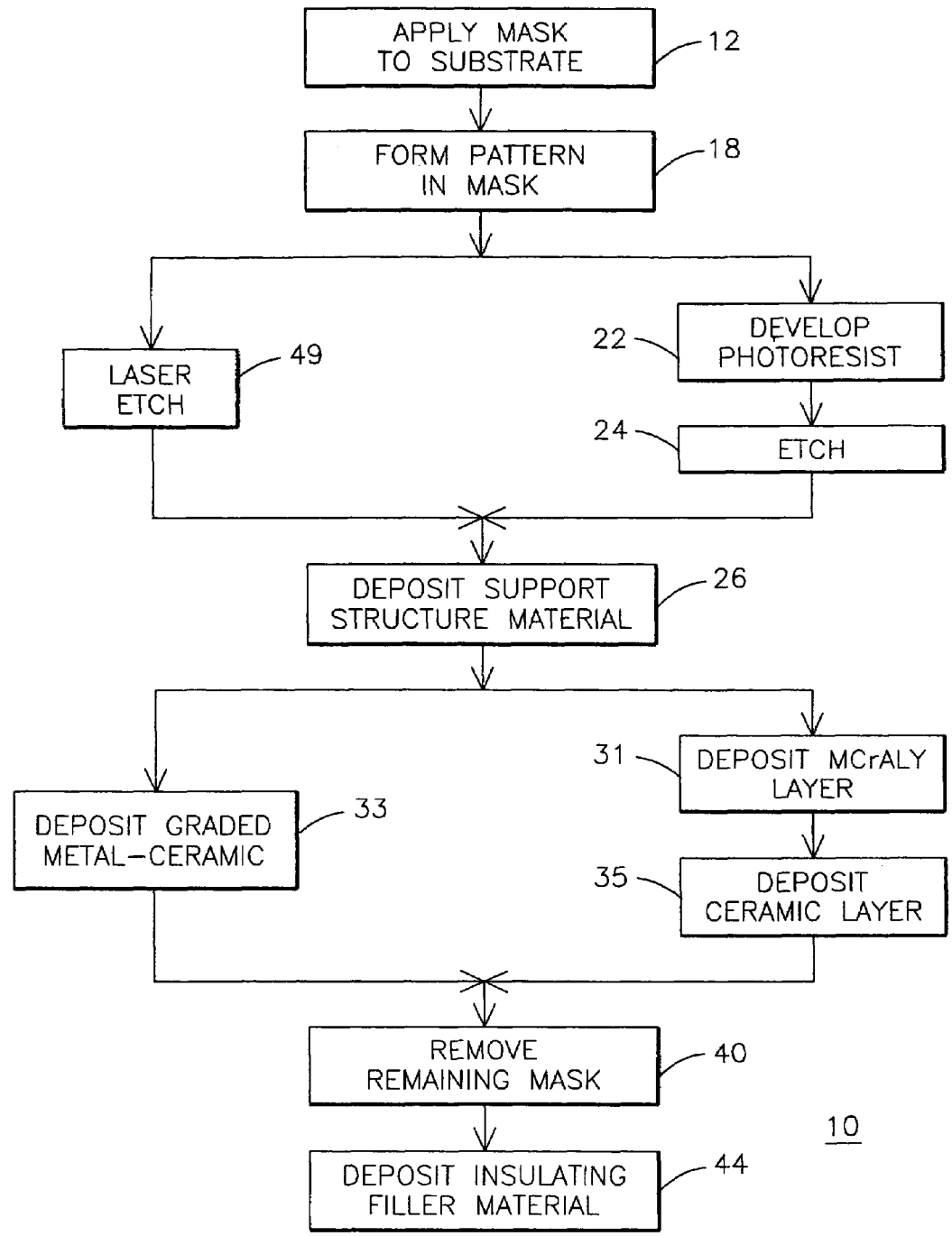
FIG. 1 is a flow diagram illustrating a process for coating a substrate with a thermal barrier coating.

FIG. 1 illustrates a process 10 for insulating a substrate with a thermal barrier coating. FIGS. 2A through 2E illustrate a partial side sectional view of a component, such as a combustion turbine blade airfoil, as it is processed through one embodiment of the method 10 of FIG. 1.

Figure 2A:
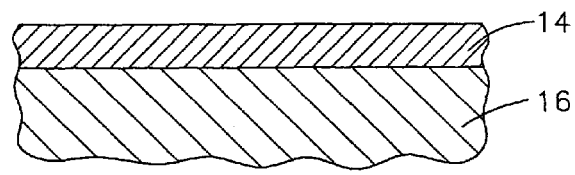
FIGS. 2A-2E illustrate a cross-sectional view of a portion of a combustion turbine blade airfoil as it is processed to receive a thermal barrier coating in accordance to one embodiment of the process illustrated in FIG. 1.

As may be appreciated by viewing FIGS. 1 and 2A-2E concurrently, and particularly FIG. 2A, a masking material 14 is applied to a substrate material 16 at process step 12. The substrate 16 may be one of the nickel or cobalt based super-alloys that are well known in the art for use in high temperature applications, as described above. The masking material 14 may be a dry film photopolymer photoresist material, such as are known in the art of microelectronics and photo lithography.

Figure 2B:
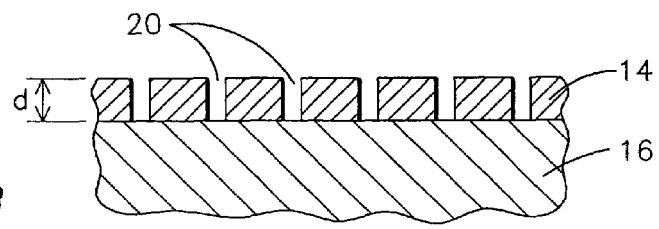

Referring now to FIGS. 2B and 1, a pattern is formed in the layer of masking material 14 at step 18. The pattern is formed by removing selected portions of the masking material 14 so that a plurality of first volumes 20 are formed in the layer of masking material 14. For the embodiment where the masking material 14 is a photoresist material, the removal of material can be accomplished by first developing a pattern in the photoresist material 14 at step 22 of FIG. 1, such as by exposing the masking material 14 to a pattern of electromagnetic radiation. Various types of photoresist materials are known to be developed by various wavelengths of energy, for example ultraviolet light. The photoresist material will undergo a change in chemistry when exposed to the electromagnetic radiation, making it more or less susceptible to a subsequent etching process. The pattern of developed and undeveloped photoresist material is then exposed to the appropriate etching process at step 24 in order to remove the selected portions of the masking material 14. The photoresist material may be selectively etched with an alkaline or acidic solution or with an ion etching process, depending upon the photoresist system selected. Such etching selectively removes one of the developed or the undeveloped photoresist materials.

Figure 3:
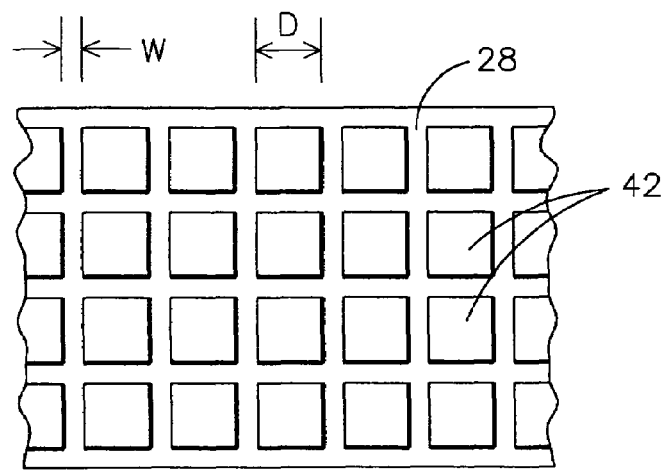
FIG. 3 is a partial top view of the component of FIG. 2B.

The pattern of first volumes 20 in the masking material 14 corresponds to the pattern used with the radiation used to develop the photoresist masking material 14. FIG. 3 generally illustrates a top view of the component of FIG. 2B, showing an exemplary pattern of first volumes 20 as trenches within a generally rectangular matrix (and the remaining masking material 14 exemplarily as columns). The first volumes 20 may each have any geometrical pattern, such as circular, oval, triangular, square, hexagonal, polygonal, curved, curvilinear, random, combinations thereof and the like, and may each have sidewalls that are straight, angled, curved, stepped, combinations thereof and the like. Similarly, the matrix can have other patterns. The width "W" of the trenches may be for example about 100-700 microns. The distance "D" between adjacent trenches may be for example about 1,000-7,000 microns. The depth "d" of the trenches may be for example about 100-1,000 microns. In one embodiment, the width "W" is about 250 microns, the distance "D" is about 1,000 microns, and the depth "d" is about 300 microns, with the trenches having a generally rectangular geometry with generally straight sidewalls.

Figure 2C:
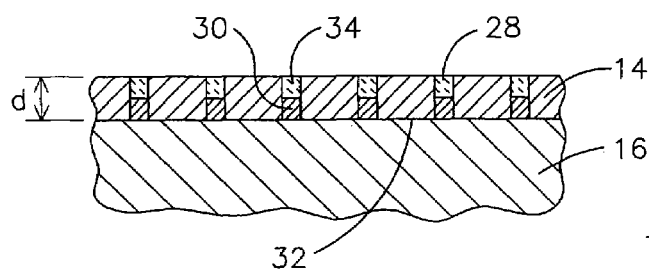

Referring to FIGS. 2B, 2C and step 26 of FIG. 1, a material is deposited into the first volumes 20 to form a support structure 28 such as a wall. The material is preferably deposited by an electro-deposition process and heat treated to provide a solid state diffusion bond to the substrate. In the embodiment of FIG. 2C, the support structure 28 includes two distinct layers of material, a first layer 30 having a first composition disposed directly on the top surface 32 of the substrate 16, and a second layer 34 having a second composition disposed on the first layer 30. The first layer 30 may be a layer of a metal such as an MCrAlY alloy or alumina deposited at step 31, and the second layer 34 may be a layer of a ceramic material deposited at step 35. The ceramic material selected for layer 34 may be any such material known in the art, such as yttria stabilized zirconia; yttria stabilized hafnia; magnesium or calcium stabilized zirconia; ceramics with a pyrochlore structure with a formula $A_2B_2O_7$ where A is a rare earth element and B is zirconium, hafnium or titanium; or any oxide material that performs as a thermal barrier coating. The metal layer 30 provides superior bonding and corrosion resistance properties, while the second layer 34 provides improved thermal insulation properties when compared to prior art reinforcing structures manufactured completely from metal. One may appreciate that one or a plurality of layers of various compositions of material may be utilized to form support structure 28.

In one embodiment a metal-ceramic composite material is applied at step 33 by electro-deposition with the composition of the composite material varying throughout the depth "d" of support structure material 28. The ceramic content of such a graded metal-ceramic composite material may be varied from approximately zero in the bottom portion of the layer proximate the top surface 32 of the substrate 16 to approximately 100% ceramic near the top of the support structure 28 opposed or distal the substrate 16. The grading percentage need not be uniform, and the depth "d" of each layer need not be similar. The metal portion of the composite material may be a nickel or cobalt based McrAlY material or other oxidation resistant bond coat material such as alumina, and the ceramic portion of the composite material may be any known thermal barrier coating ceramic and may be selected from the ceramics described above. The electro-deposition of support structure 28 may be accomplished with techniques well known in the art. Such electro-deposition techniques result in a support structure which requires only an additional heat treatment step to provide a solid state diffusion bond to the substrate. In this manner, there is no need to use an additional material to join a prefabricated support structure as in the prior art. This eliminates any need for a brazing material that may melt at a relatively low temperature and eliminating any concern regarding the formation of a heat affected zone in the substrate. Furthermore, electro-deposition will ensure that the support structure material will penetrate the depth "d" fully to cover the entire area of substrate exposed at the bottom of volumes 42 without any concern of shadowing as may exist for processes involving the impingement of material.

Figure 2D:
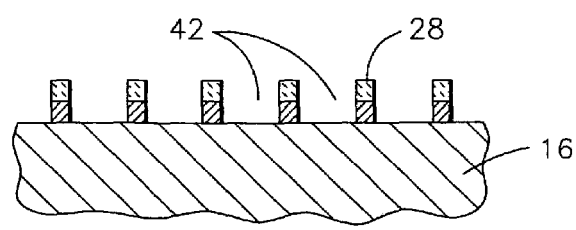

Referring to FIGS. 2C, 2D and step 40 of FIG. 1, the remaining mask material 14 may then be removed to yield the structure illustrated in FIG. 2D. The removed mask material 14 forms a pattern of second volumes 42 such as cells, into which an insulating ceramic filler material 46 can be deposited at step 44 of FIG. 1. The second volumes 42 can be sized and shaped similar to the first volumes 20, but preferably have a larger width "W" (e.g. about 1.5-20 times greater than the first volumes 20), with the illustrated second volumes having a width "W" about 3-5 times greater. The depth "d" of the first and second volumes 20, 42 need not be similar.

Figure 2E:
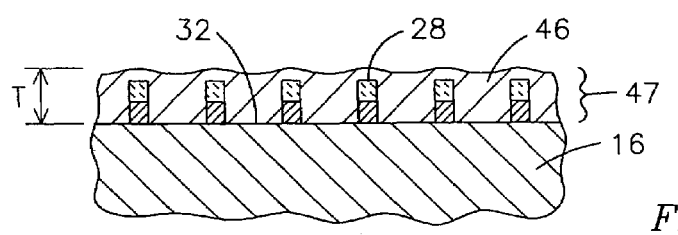

As illustrated in FIG. 2E, ceramic filler material 46 may be deposited by an electro-deposition process to a thickness "T" sufficient to cover the support structure 28, thereby forming the thermal barrier coating 47. The filler material layer 46 may be any known ceramic thermal barrier coating material, including being the same material as layer 34 of support structure 28. Layer 46 may deposited into the second volume 42 to any desired depth, but preferably to at least a depth "d" equal to the height of the support structure 28. Step 44 may also be accomplished by slurry deposition, plasma spraying, chemical vapor deposition, physical vapor deposition, directed vapor deposition, sol gel or high velocity oxy-fuel deposition. In one embodiment, the thickness "T" of a ceramic insulating material may be 750 microns. As is evident from FIG. 2E, the thermally insulating filler material 46 is bonded to the surface 32 of the substrate and to the support structure 28 along a plurality of surfaces. The top corners of support structure 28 tend to act as stress concentrators. Furthermore, the interface between metal layer 30 and ceramic layer 46 will generate stresses due to differences in the coefficients of thermal expansion. However, by including the ceramic layer 34 on top of metal layer 30, the location of the metal/ceramic stress concentrator is moved to a location having lower temperature gradients due to the insulating function of ceramic layers 34 and 46. Accordingly, the structure disclosed herein will be less prone to failure than prior art devices where the support structure 28 is all metal.

Figure 4:
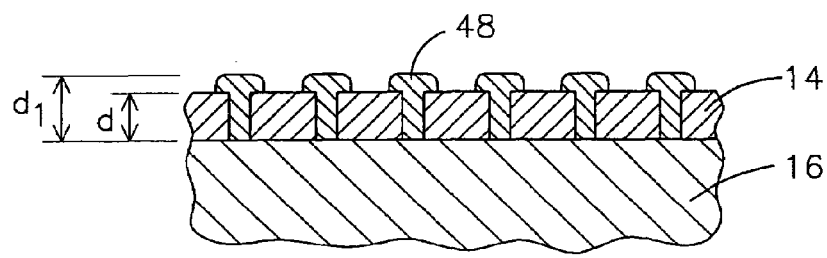
FIG. 4 is a partial cross-section view of another embodiment of a component being coated with a thermal barrier coating in accordance with the process of FIG. 1.

One may appreciate that the shape of the support structure 28 may be further defined to provide an additional level of mechanical interface between the support structure 28 and the insulating material 46. FIG. 4 illustrates an embodiment of a graded composition support structure 48 that has a T-shaped cross-section. This shape is achieved by the electro-deposition of support structure material to a depth "$d_1$" that exceeds the depth "d" of masking material 14, thus forming the T-shape. In this embodiment, the composition of the support structure material is also graded from the bottom to the top of the structure 28. The top portion of the T-shaped structure acts as an anchor providing additional mechanical interface with the subsequently deposited ceramic insulating material. One may envision other support structure shapes that may be used to provide additional anchoring of the ceramic insulating material. More complicated shapes may be formed by using multiple layers of patterning material and multiple material deposition steps.

Figure 5:
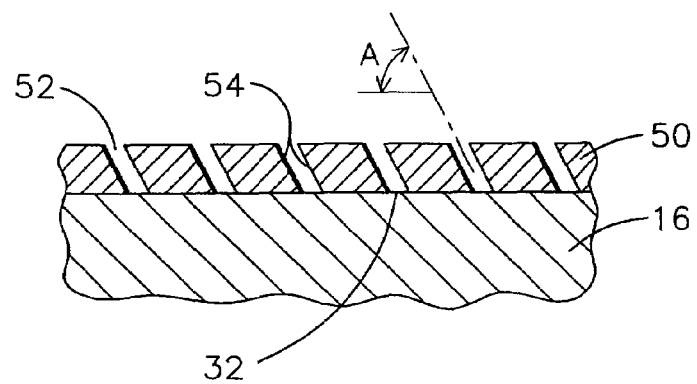
FIG. 5 is a partial cross-sectional view of a component coated with a masking material having a pattern engraved by a laser etching process.

Returning to FIG. 1, the pattern may be formed in the masking material at step 18 by a variety of techniques other than photo-developing. Such techniques may include water jet cutting, focused flame cutting, mechanical cutting, stamping, injection molding, electro-chemical machining and electro-discharge machining. In one embodiment, laser energy is used to etch a desired pattern of first volumes 20 in the masking material 14 at step 49. For this embodiment, the masking material need not be a photoresist material, and may preferably be an epoxy resin deposited by any known technique such as spraying, dipping, or layering of preforms. FIG. 5 illustrates a substrate 16 having a layer of epoxy resin mask material 50 deposited thereon. Laser energy of a predetermined wavelength and intensity is then directed toward the substrate 16 to vaporize a portion of the epoxy resin 50 to form a plurality of first volumes 52. Such a process can conveniently be applied to a flat substrate or to a curved surface such as may be found on the airfoil section of a combustion turbine blade. The laser energy may be directed toward the substrate 16 at a predetermined angle "A" in relation to the plane of the top surface 32 of the substrate 16 to form first volumes 52 having inclined side walls 54. The subsequent deposition of support structure material at step 26 and insulating filler material at step 44 will result in a structure having an improved mechanical bond between the ceramic insulating material and the substrate resulting from the angle "A" being less than 90 degrees. Such a structure may also be less susceptible to damage resulting from the impact of foreign objects, such as in an application involving the flow of high temperature, high velocity fluids over a structure. Support structure materials may be deposited by electroplating a metal or electro-depositing a metal-ceramic composite material into the first volumes 52 in a manner similar to that described above for the structure of FIGS. 2B-2C.

Referring to FIGS. 3 and 2E, in one embodiment the pattern of first volumes 20 can define trenches that are filled with material(s) to form support structures 28 such as walls, and the second volumes 42 can remain unfilled to define cells, thereby forming a honeycomb structure. The honeycomb structure can have any desired geometrical pattern when viewed in cross-section a direction generally perpendicular to the top surface 32 of the substrate 16 or other surface. Such geometrical patterns including generally hexagonal, rectangular, square, triangular, circular, oval, polygonal, curved, curvilinear, random, combinations thereof and the like. Also, the honeycomb structure can have other three-dimensional configurations, such as cubical, trapezoidal, parallelpiped, spherical, ellipsodial, combinations thereof and the like. Further the honeycomb structure can have walls that are straight, angled, curved, stepped, combinations thereof and the like. Electro-deposition of the overlying ceramic insulating material once the resin is removed will ensure that the ceramic material fully covers the underlying substrate in spite of the or any angularity of the support structure side walls 54 with respect to the surface of the substrate 16.

In one embodiment, the insulating filler material 46 is deposited at step 44 in the form of particles of a ceramic material coated with a bonding material, as is known in the art. The bonding material may be selected to be aluminum or $AlPO_4$, mullite, silica or other material forming a chemical bond between adjacent particles upon heating. Once the particles are deposited into the second volumes 42, the structure may be heated to cause the bonding material to oxidize, thereby bonding the individual particles together to form a bonding layer. Such ceramic filler material may be deposited into the second volumes 42 by any one of an electrophroetic, sol-gel or slurry process, as are known in the art. For very high temperature applications such as combustion turbines, the less expensive nickel coated ceramic particles would normally be avoided, since the bond between adjacent nickel particles would fail at temperatures exceeding about 800 degrees Centigrade.

Figure 6:
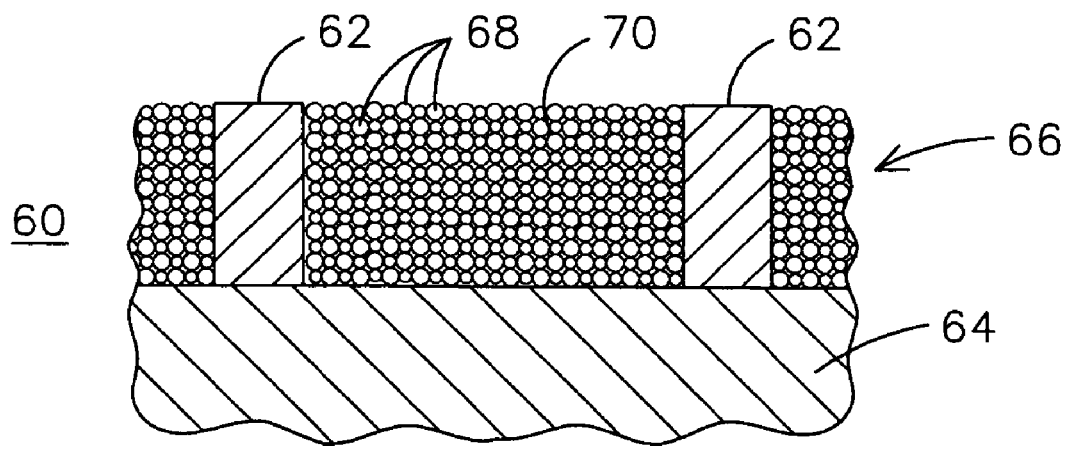
FIG. 6 is a partial cross-sectional view of a component coated with a thermal barrier coating in accordance with the process of FIG. 1 wherein the insulating material includes solid or hollow zirconia spheres embedded in a zirconia or alumina matrix.

FIG. 6 illustrates an embodiment of an insulated component 60 which uses nickel coated ceramic insulating particles and is useful at temperatures well in excess of 1,000 degrees Centigrade. Support structures 62 such as walls are formed on a substrate 64 in a manner as described above, and an insulating material 66 is deposited within the second volumes 42 such as cells as described above. However, insulating material 66 includes a plurality of hollow or solid oxide spheres 68 of various dimensions or of similar dimensions, with each sphere 68 covered by a layer of nickel. Sphere sizes may range from 5 microns to 200 microns and the layer of nickel on each sphere may range from 0.1 micron to 25 microns in thickness. Such nickel coated oxide particles are known in the art and may be obtained from Westaim Corporation of Alberta, Canada. Adjacent particles are then bonded together by heating the particles to about 600 degrees Centigrade to 1,200 degrees Centigrade to cause the adjoining nickel layers to bond together. The spaces between adjacent particles 68 are then filled with aluminum or the like to provide oxidation resistance to the bonding agent between the spheres. This may be accomplished by infiltrating the spaces with aluminum chloride gas in a pack aluminizing process as is known in the art. The typical process involves the reaction of aluminum to the nickel on the zirconia particles and the formation of a nickel-aluminide layer between the spheres 68. The component 60 is then elevated to a temperature in the range of 800-1,500 degrees Centigrade, either during a subsequent processing step or during in-service exposure to high temperatures. At such temperatures, the aluminum will convert to a stable alumina matrix material 70. The alumina not only provides additional mechanical strength for retaining the ceramic spheres 68, but also is phase stable at operating temperatures in the range of 800-1,500 degrees Centigrade. Aluminum can also be deposited directly onto the spheres followed by the bonding process. Other metals may be used in lieu of nickel as the initial bonding agent, for example any transition metal, rare earth metal or refractory metal. In other embodiments, the volume fraction of the ceramic material may be less than full density, with the matrix material providing the necessary mechanical connection between adjacent particles. The particles may be spheres, cubes, discs, plates or other shapes. Furthermore, in lieu of a ceramic particle, a matrix material may be formed to contain a controlled quantity of hollow pores in any manner known in the art. Importantly, the filler material provides a thermal insulating property to protect the underlying substrate while the support structure provides superior mechanical integrity for the insulating filler material. Also, the support structure 28 and/or the overall honeycomb structure can localize and segregate cracks within the first volumes 42 or other portions of the thermal barrier coating to inhibit, if not prevent, the cracks from combining with other cracks.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

I claim as my invention:

1. A process for manufacturing a device, the process comprising:
 coating a top surface of a substrate with a layer of masking material;
 removing a selected portion of the masking material to form a pattern of first volumes in the layer of masking material;
 depositing a support structure material in the first volumes to form a support structure attached to the top surface of the substrate;
 removing a remaining portion of the masking material to form a pattern of second volumes; and
 depositing a thermally insulating filler material in the second volumes;
 wherein the step of depositing a support structure material further comprises depositing a first layer of support structure material having a first composition onto the top surface of the substrate and depositing a second layer of support structure material having a second composition different than the first composition onto the first layer of support structure material.

2. The process of claim 1, further comprising:
 selecting the masking material to be a photo-resist material;
 wherein the step of removing a selected portion of the masking material comprises:
 exposing the photo-resist material to a pattern of energy to define a pattern of developed and undeveloped photo-resist material; and
 removing one of the developed and the undeveloped photo-resist material to form the pattern of first volumes.

3. The process of claim 1, wherein the step of removing a selected portion of the masking material comprises applying laser energy to the layer of masking material to vaporize a selected portion of the masking material to form the pattern of first volumes.

4. The process of claim 3, further comprising applying the laser energy at a predetermined angle in relation to the plane of the top surface of the substrate to form the first volumes to have inclined side walls.

5. The process of claim 1, further comprising selecting the masking material to be an epoxy resin.

6. The process of claim 1, wherein the step of depositing a support structure material further comprises electroplating a support structure material onto the top surface of the substrate.

7. The process of claim 1, wherein the top surface of the substrate comprises a curved surface, and further comprising removing a selected portion of the masking material by applying laser energy to form a honeycomb pattern of first volumes in the layer of masking material.

8. The process of claim 1, wherein the step of depositing a thermally insulating filler material further comprises:
- depositing the thermally insulating filler material in the form of particles of a ceramic material coated with nickel;
- heating the particles to form an oxide bond between adjoining particles;
- depositing aluminum in volumes between the particles; and
- heating the aluminum to form alumina between the particles.

9. The process of claim 1, further comprising:
- selecting the thermally insulating filler material from the group consisting of yttria stabilized zirconia, yttria stabilized hafnia, magnesium stabilized zirconia, calcium stabilized zirconia, and a ceramic with a pyrochiore structure having a formula $A_2B_2O_7$ where A is a rare earth element and B is zirconium, hafnium or titanium; and
- depositing the filler material in the second volumes by one of an electrophoretic, sol-gel or slurry process.

10. A process for manufacturing a device, the process comprising:
- coating a top surface of a substrate with a layer of masking material;
- removing a selected portion of the masking material to form a pattern of first volumes in the layer of masking material;
- depositing a support structure material in the first volumes to form a support structure attached to the top surface of the substrate, the support structure material being changed during the step of depositing such that the support structure comprises a first composition in a bottom portion proximate the top surface of the substrate and a second composition different than the first composition in a top portion proximate a top of the support structure;
- removing a remaining portion of the masking material to form a pattern of second volumes; and
- depositing a thermally insulating filler material in the second volumes.

11. The process of claim 10, wherein the step of depositing further comprises depositing a support structure material comprising a graded metal-ceramic composition in the first volumes, wherein a ceramic content of the composition is higher in the top portion than in the bottom portion.

12. The process of claim 10, wherein the step of depositing further comprises depositing a ceramic material in the top portion.

13. The process of claim 11, further comprising forming the support structure to have side walls that are inclined at a non-perpendicular angle to the top surface of the substrate.

14. A process for manufacturing a device, the process comprising:
- coating a top surface of a substrate with a layer of masking material;
- removing a selected portion of the masking material to form a pattern of first volumes in the layer of masking material;
- depositing a support structure material in the first volumes to a depth exceeding a depth of the masking material to form a support structure comprising a T-shaped structure affixed to the substrate;
- removing a remaining portion of the masking material to form a pattern of second volumes; and
- depositing a thermally insulating filler material in the second volumes;
- wherein the T-shaped structure acts as an anchor providing a mechanical interface between the substrate and the filler material.

15. The process of claim 14, further comprising depositing the support structure material to comprise a ceramic material in a top portion of the T-shaped structure.

16. The process of claim 14, further comprising depositing the support structure material to comprise a graded metal-ceramic material wherein a ceramic content of the graded material is higher in a top portion of the T-shaped structure than in a bottom portion.

* * * * *